United States Patent [19]
Nakano

[11] Patent Number: 5,960,334
[45] Date of Patent: Sep. 28, 1999

[54] AMPLIFIER AND PORTABLE TELEPHONE APPARATUS USING THE SAME

[75] Inventor: Kazuhiro Nakano, Fukushima-ken, Japan

[73] Assignee: Alps Electric Co., Ltd., Tokyo, Japan

[21] Appl. No.: 08/850,904

[22] Filed: May 2, 1997

[30] Foreign Application Priority Data

May 15, 1996 [JP] Japan ................................. 8-145096

[51] Int. Cl.[6] .................................................. H04B 1/18
[52] U.S. Cl. .......................... 455/188.1; 455/180.1; 455/315; 455/318; 455/319; 330/302; 330/306
[58] Field of Search ................................. 455/552, 553, 455/180.1, 188.1, 254, 315, 318, 319, 323, 333, 341; 330/302, 306, 294, 303, 207 A, 251, 109; 331/177 D, 116 R

[56] References Cited

U.S. PATENT DOCUMENTS 4,797,638  1/1989  Usui et al. ............................ 331/117

*Primary Examiner*—Wellington Chin
*Assistant Examiner*—Pablo Tran
*Attorney, Agent, or Firm*—Brinks Hofer Gilson & Lione

[57] ABSTRACT

An amplifier and a portable telephone apparatus using the same in which a resonance circuit is provided for each of different frequencies and bypass capacitors of the ground terminal of a transistor are properly switched according to the different frequencies. Two capacitors connected to each other in series for the parallel resonance circuits to be connected to the output terminal of the amplifying transistor are used for the resonance capacitors for the higher frequency. For the lower frequency, one of the tow capacitors that is on the ground side is used as a bypass capacitor that grounds the ground terminal of the transistor in a high frequency manner, the other capacitor being functioned as a resonance capacitor at that frequency.

10 Claims, 3 Drawing Sheets

AMPLIFIER AND PORTABLE TELEPHONE APPARATUS USING THE SAME

BACKGROUND OF THE INVENTION

The present invention relates to an amplifier for amplifying oscillation signals and, more particularly, to an amplifier for amplifying a local oscillation signal of a receiving section or a carrier signal of a transmitting section and a portable telephone apparatus using this amplifier.

The communication frequency band for use in portable telephone apparatuses depends on the communication scheme used. For example, PDC (Personal Digital Cellular) operates on one of two frequency bands of 800 MHz and 1600 MHz. These frequency bands are selectively used depending on geographical regions. Therefore, if the user of the 800 MHz band telephone moves into the 1600 MHz band region for example, the telephone becomes unserviceable. Thus, it is desired to provide a portable telephone apparatus that is compatible with both the frequency bands.

Referring to FIG. 3, there is shown a portion of the constitution of the receiving section of a related-art portable telephone apparatus. In the figure, reference numeral 1 denotes an antenna, reference numeral 2 a receive signal amplifier, reference numeral 3 a mixer, reference numerals 4 and 5 local oscillators (hereinafter simply referred to as oscillators) for generating local oscillation signals, and reference numeral 6 a local oscillation signal amplifier. In the above-mentioned constitution, a receive signal received by the antenna is amplified by the amplifier 2. The amplified signal is inputted in the mixer 3. In the mixer 3, the inputted signal is mixed with a local oscillation signal inputted via the amplifier 6 to be frequency-converted into an intermediate frequency signal. The oscillators 4 and 5 are voltage-controlled oscillators that are controlled by a PLL (Phase-Locked Loop) circuit, not shown, and oscillate at different frequencies, for example 800 MHz and 1600 MHz respectively. The amplifier 6 has an amplifying transistor 7 and a parallel resonance circuit 8. The amplifying transistor 7 has a base 9 providing the input terminal, a collector 10 providing the output terminal, and an emitter 11 providing the ground terminal in a high frequency manner. Reference numerals 12 and 13 denote base bias resistors, reference numeral 14 an emitter bias resistor, reference numeral 15 a bypass capacitor for grounding the emitter 11 in a high frequency manner, and reference numeral 16 a decoupling capacitor for a power supply line 17.

One end of a microstrip line 18 and one end of a capacitor 19 are connected to the collector 10 while the other end of the microstrip line 17 and the other end of the capacitor 19 are connected to the power supply line 18 and ground respectively. The microstrip line 18 and the capacitor 19 constitute the parallel resonance circuit 8. It should be noted that the microstrip line 18 works as inductance. The power supply line 17 is applied with voltage Vcc via a power supply terminal 20. The power supply line 17 and ground are at the substantially same potential relative to high-frequency signal. Reference numerals 21 and 22 are coupling capacitors for the input and the output of the amplifier 6 respectively. Reference numeral 23 is a selector switch for selecting between the oscillators 4 and 5.

One of the oscillation frequencies of the oscillators 4 and 5 is selected by the selector switch 23. The selected output is amplified by the amplifier 6 of the next stage. The amplified signal is mixed by the mixer with a receive signal transmitted from the amplifier 2 to be frequency-converted. The converted signal is then outputted to a detector and so on in the subsequent stage.

The amplifier 6 must amplify the oscillation signals of both frequencies 800 MHz and 1600 MHz. It is difficult, however, for the amplifier 6 to amplify with a wind band from 800 MHz to 1600 MHz, so that the amplifier 6 is constituted by a tuned amplifier. Consequently, the resonance frequency of the parallel resonance circuit 8 composed of the microstrip line 18 and the capacitor 19 is set to a level generally at the center between these frequencies; 1200 MHz for example. As a result, the amplifier 6 provides the maximum amplification degree (gain) for 1200 MHz but provides a lower amplification degree for 800 MHz or 1600 MHz.

FIG. 4 shows a second related-art example. In the figure, reference numerals 24 and 25 denote amplifiers for amplifying only the oscillation signals of the oscillators 4 and 5 respectively. Reference signal 26 denotes a selector switch for switching between the output signals of the amplifiers 24 and 25. In this second example, the amplifier 24 has a parallel resonance circuit that tunes in to 800 MHz of the oscillator 4 and the amplifier 25 has a parallel resonance circuit that tunes in to 1600 MHz of the oscillator 5, these parallel resonance circuits are basically the same as the amplifier 6 of FIG. 3 in constitution. Thus, it is possible to constitute the amplifiers that have the resonance circuits suitable for these frequencies.

However, the above-mentioned related-art examples have the following problems. In the first related-art example, the amplifier 6 is used to amplify both the oscillation signals of the oscillators 4 and 5 having different frequencies, so that the resonance frequency of the parallel resonance circuit is set to 1200 MHz which is approximately at the center between the oscillation frequencies. Consequently, at the frequencies 800 MHz and 1600 MHz, the amplifier 6 is used with amplification degrees (gain) lower than the maximum level of the amplifier 6, failing to provide a sufficient amplification degree.

The bypass capacitor 15 may originally be one that has a capacity making reactance small enough relative to the resistance of the bias resistor 14 at the lower frequency 800 MHz. However, use of such a capacitor increases the reactance due to the inductance of the capacitor electrode at the higher frequency 1600 MHz, lowering the bypass effect. Hence, actually, the bypass capacitor 15 having the self resonance frequency at 1200 MHz to obtain intermediate performance.

To be more specific, as shown in the reactance characteristic diagram of FIG. 5, due to the inductance of capacitor electrode, a capacitor having a large capacity (C1) has a relatively low self resonance frequency (for example, 800 MHz) and a capacitor having a small capacity (C2) has a relatively high self resonance frequency (for example, 1600 MHz). Therefore, in the above-mentioned related-art example, a capacitor (C3) having the self resonance frequency at 1200 MHz is used as the bypass capacitor 15 as with the above-mentioned parallel resonance circuit. This, however, makes the reactance due to capacity or electrode inductance not negligible at 800 MHz or 1600 MHz to apply negative feedback to the amplifier, thereby further lowering the amplification degree. This, in turn, disables sending a local oscillation signal having enough level to the mixer 3, thereby lowering the frequency conversion gain of the mixer.

In the above-mentioned second related-art example, because the amplifiers 24 and 25 are dedicated to the oscillators 4 and 5 respectively, the problem of the first related-art example is not caused but the two amplifiers are required, which is disadvantageous in cost. Further, use of the two amplifiers prevents the portable telephone apparatus from being further reduced in size and weight.

SUMMARY OF THE INVENTION

It is therefore an object of the present invention to provide an amplifier which provide a sufficient amplification degree.

It is another object of the invention to provide a portable telephone apparatus reduced in size, weight and cost.

According to one aspect of the present invention, there is provided an amplifier comprising: an amplifying transistor; a parallel resonance circuit connected at one end thereof to an output terminal of the amplifying transistor and having at least two capacitors connected in series; a bypass capacitor connected to the amplifying transistor connected between a ground terminal of the amplifying transistor and ground; and a switching means for switching between a connected state and a disconnected state of a connection point between at least the two capacitors and ground or the connection point and the ground terminal; wherein one of at least the two capacitors that is on the ground side is provided with a reactance small enough relative to a first frequency which is relatively low and the bypass capacitor is provided a reactance small enough relative to a second frequency which is relatively high.

According to another aspect of the present invention, there is provided a portable telephone apparatus, wherein the above-mentioned amplifier is disjunctively connected to one of the above-mentioned oscillators having different frequencies in correspondence to the switching of the above-mentioned switching means.

The above and other objects, features and advantages of the present invention will become more apparent from the accompanying drawings, in which like reference numerals are used to identify the same or similar parts in several views.

DETAILED DESCRIPTION OF PREFERRED EMBODIMENTS

Figure 1:
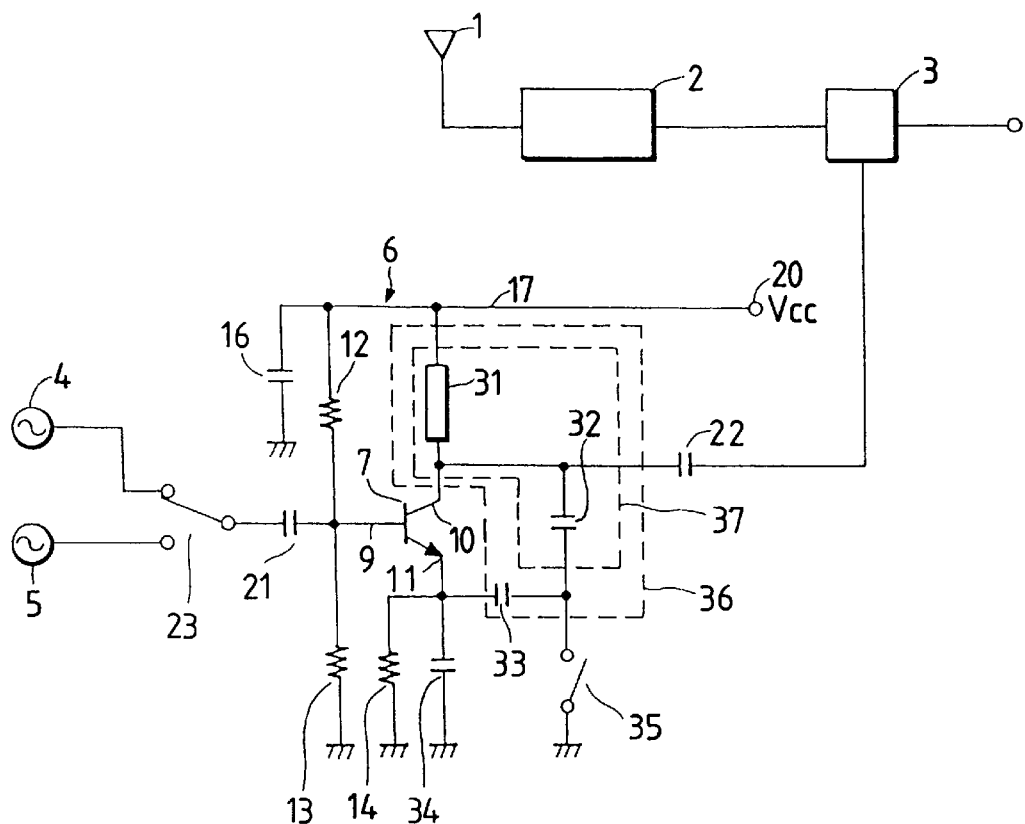
FIG. 1 is a circuit diagram illustrating the amplifier and the portable telephone apparatus practiced as a first preferred embodiment of the present invention.
Figure 3:
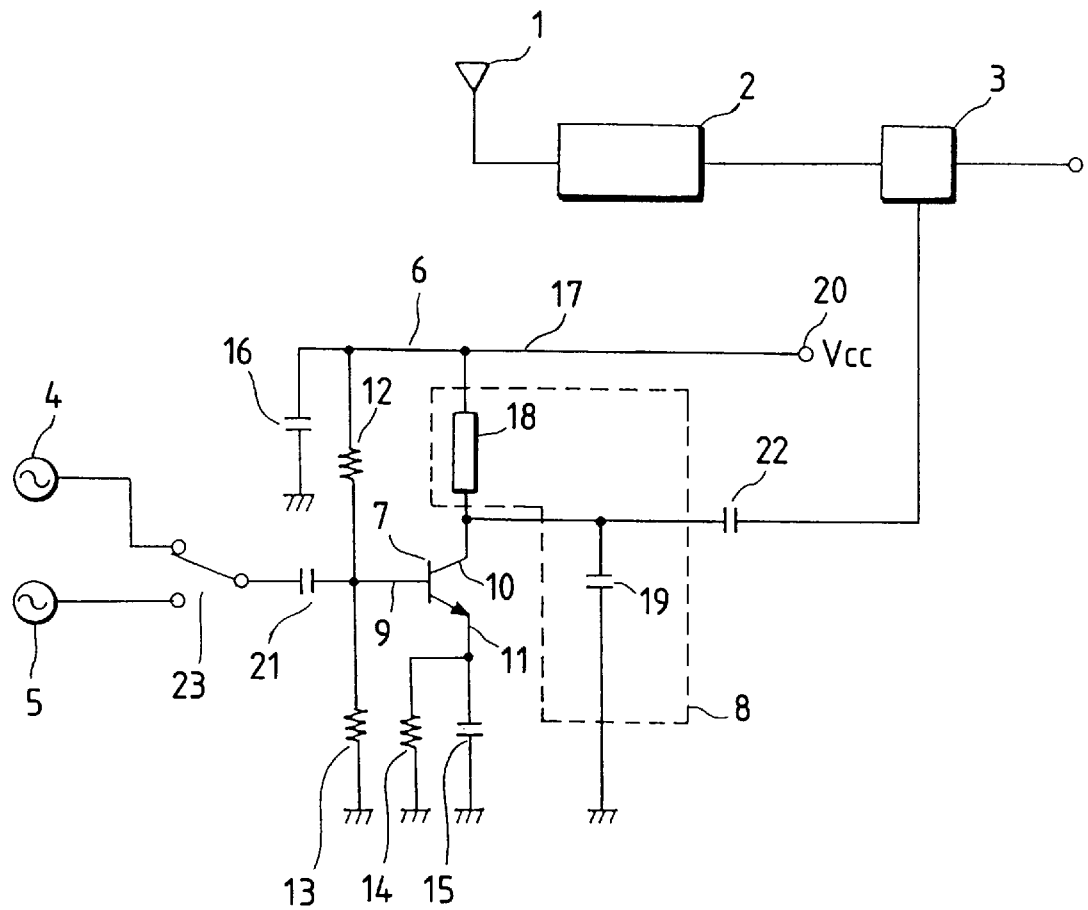
FIG. 3 is a circuit diagram illustrating one portion of the receiving section of a related-art portable telephone apparatus.
Figure 4:
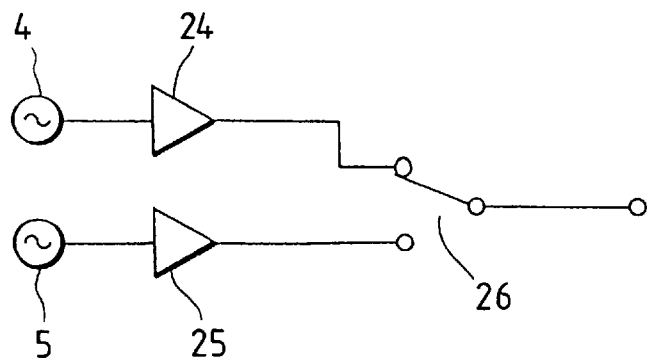
FIG. 4 is a circuit diagram illustrating the related-art connection between local oscillators and amplifiers.
Figure 5:
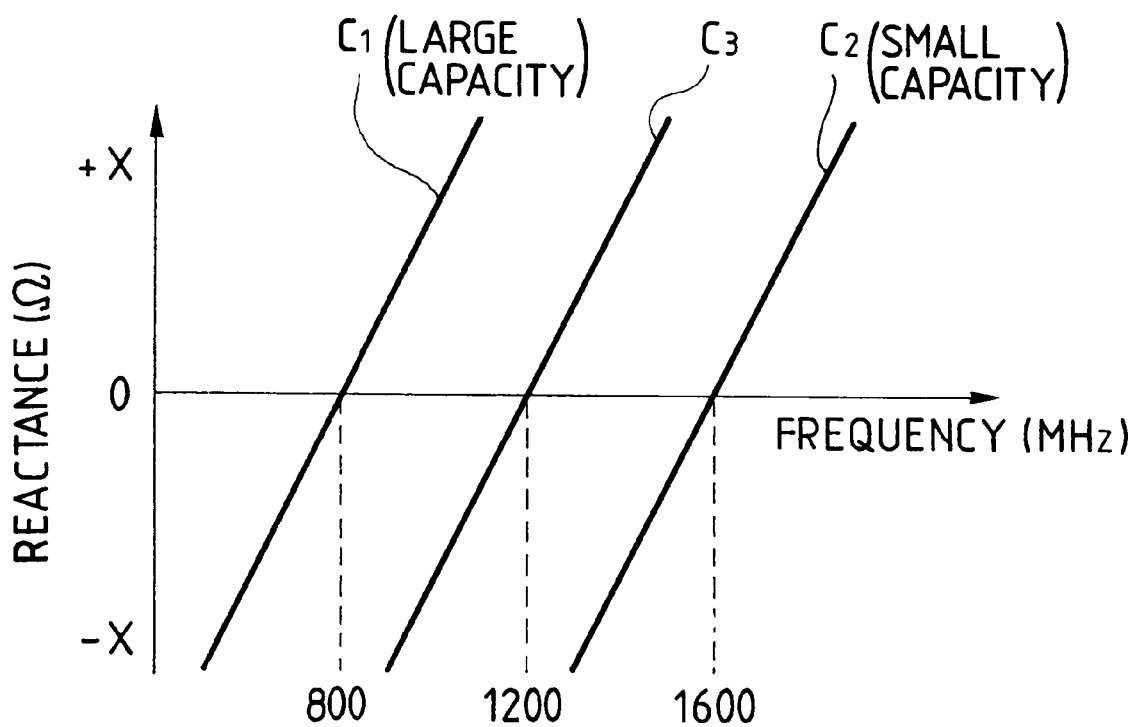
FIG. 5 is a diagram illustrating the reactance characteristics of capacitors.

FIG. 1 shows the first embodiment of the present invention in which the amplifier according to the present invention is applied to a portable telephone apparatus. With reference to FIG. 1, components similar to those described in FIG. 3 are denoted by the same reference numerals and the description of those components will be omitted. Now, referring to FIG. 1, reference numeral 30 denotes an amplifier according to the present invention. Reference numeral 31 denotes a microstrip line. Reference numerals 32 and 33 denote capacitors. Reference numeral 34 denotes a bypass capacitor of an emitter 11 providing the ground terminal of a transistor 7. A reference numeral 35 denotes a switch. The microstrip line 31 is connected between a collector 10 providing the output terminal of the transistor 7 and a power supply line 17. The capacitors 32 and 33 are connected to each other in series and connected between the collector 10 and the emitter 11. The switch 35 is provided between the connection point of the two capacitors 32 and 33 and ground. When the switch 35 is open (disconnected), the capacitors 32 and 33 connected to each other in series are connected to ground via the bypass capacitor 34, so that the two capacitors 32 and 33 along with the microstrip line 31 constitute a parallel resonance circuit 36 that tunes in to 1600 MHz for example. In this case, the capacity of the bypass capacitor 34 is selected as shown in C2 of FIG. 5 such that the emitter 11 is connected to ground with a reactance low enough at the above-mentioned frequency. When the switch 35 is closed (connected), the connection point of the two capacitors is connected to ground, the capacitor 32, along with the microstrip line 31, constituting a parallel resonance circuit 37 that tunes in to the other frequency, for example 800 MHz. At this moment, the capacitor 33 is connected between the emitter 11 and ground. The capacity of the capacitor 33 is selected as shown in C1 of FIG. 5 such that the reactance is small enough at 800 MHz. Consequently, the emitter 11 is grounded at 800 MHz in a high frequency manner. That is, in this case, the capacitor 33 serves as a bypass capacitor.

The following describes a method of setting the microstrip line 31, the two capacitors 32 and 33, and the bypass capacitor 34 that constitute the resonance circuit. First, a capacitor (equivalent to C2 of FIG. 5) having a self resonance frequency at the higher frequency 1600 MHz is set as the bypass capacitor 34. Next, a capacitor (equivalent to C1 of FIG. 5) having a self resonance frequency at the lower frequency 800 MHz is set as the capacitor 33 connected on the ground side of the two capacitors connected to each other in series. The capacity of the other capacitor 32 and the inductance of the microstrip line 31 are obtained from the following two equations:

$$C_{32} = C_{33} \times \left( \frac{Fn^2}{Fl^2} - 1 \right)$$

$$L = \frac{1}{4\pi^2 F_l^2 C_{32}}$$

where, Fh denotes the higher frequency, Fl denotes the lower frequency, C32 denotes the capacity of the capacitor 32, C33 denotes the capacity of the capacitor 33, and L denotes the inductance of the microstrip line 31. Actually, these values must be determined by considering the length of the wire conductors on the printed circuit board on which the present embodiment is mounted. However, according to the above-mentioned equations and by empirically performing corrections, 47 Pf, 18 Pf, and 10 Pf were obtained for the capacitors 32, 33, and 34 respectively. It should be noted that the present embodiment uses leadless laminated capacitors generally known as chip capacitors. This is because the capacitors of this type have the same external dimensions regardless of their capacities. Therefore, the dimensions of the electrodes are the same throughout the capacitors, providing generally the same electrode inductance throughout the capacitors, resulting in generally the uniform relationship between capacity and self resonance frequency (that is, as the capacity rises, the self resonance frequency falls). This facilitates the setting of the capacity values when the capacitors of this type are used for the bypass capacitors (C33 and C34) connected to the emitter.

Figure 2:
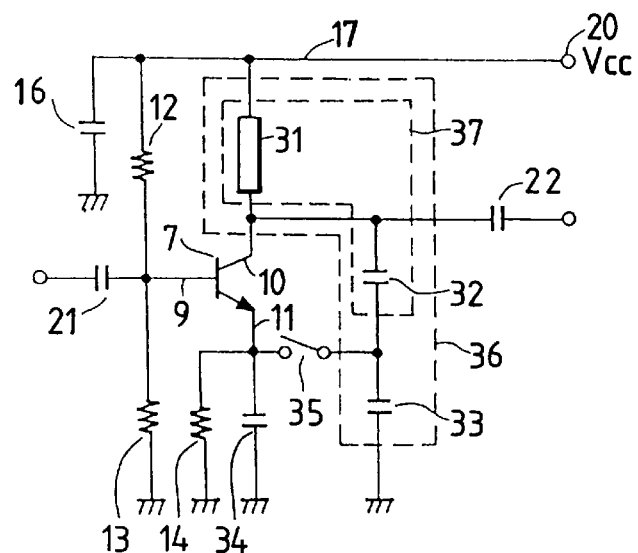
FIG. 2 is a circuit diagram illustrating the amplifier practiced as a second preferred embodiment of the present invention.

FIG. 2 shows a circuit diagram illustrating the amplifier practiced as a second preferred embodiment of the present invention. The second embodiment differs from the first embodiment in that the positions at which the capacitor 33 and the switch 35 are mounted are reversed. To be specific, the microstrip line 31 is connected between the collector 10 and the power supply line 17 and the two capacitors 32 and 33 connected to each other in series are connected between the collector 10 and ground. The connection point between the capacitors 32 and 33 is connected to the emitter 11 via the switch 35. In the second embodiment, when the switch 35 is open, the capacitors 32 and 33 also constitute, along with the microstrip line 31, the resonance circuit 36 of the higher frequency. When the switch 35 is closed, the emitter 11 is connected to ground via capacitor 33, only the capacitor 32 constituting the resonance circuit of the lower frequency 37 along with the microstrip line 31.

In each of the above-mentioned embodiments, the oscillator 4 or the oscillator 5 is selected by the switch 23 according to whether the switch 35 is open or closed, thereby amplifying the local oscillation signals having different frequencies with the maximum amplification degree. In this case, interlocking the switch 35 and switch 23 can simultaneously perform the oscillator selection, the switching between the resonance circuits of the amplifier, and the switching between the bypass capacitors to be connected between the emitter 11 and ground. In the above-mentioned embodiments, the constitution having the two oscillators 4 and 5 is used. It will be apparent that the oscillation frequency switching is performed by only one oscillator under the control of a PLL circuit and this switching can be interlocked with the switch 23 with ease.

Thus, according to the present invention, the connection point between the two capacitors connected to each other in series is connected to ground in a high frequency manner if different frequencies are given and, at the same time, of the two capacitors, the capacitor on the ground side is set to a reactance small enough for the bypass capacitor for the emitter of the transistor at the lower frequency, thereby providing a sufficient amplification degree with a single amplifier even for the different frequencies.

In the above-mentioned two embodiments, the amplifier for the local oscillation signal to be used for the frequency conversion in the receiving section has been described. It will be apparent that the amplifier according to the present invention may be used for another section in the portable telephone apparatus. For example, if this amplifier is used in the carrier signal oscillator, the single amplifier can handle the carrier signals having different frequencies due to different transmission schemes. It will also be apparent that, if this amplifier is used to amplify received signals, the single amplifier can handle the received signals having different frequencies.

As described and according to the present invention, an amplifier comprising: an amplifying transistor; a parallel resonance circuit connected at one end thereof to an output terminal of the amplifying transistor and having at least two capacitors connected in series; a bypass capacitor connected to the amplifying transistor connected between a ground terminal of the amplifying transistor and ground; and a switching means for switching between a connected state and a disconnected state of a connection point between at least the two capacitors and ground or the connection point and the ground terminal; wherein one of at least the two capacitors that is on the ground side is provided with a reactance small enough relative to a first frequency which is relatively low and the bypass capacitor is provided a reactance small enough relative to a second frequency which is relatively high. This novel constitution allows the single amplifier to switch between the parallel resonance circuits to be connected to the output terminal of the amplification transistor and the bypass capacitors to be connected to the ground terminal according to the two different frequencies, thereby providing a sufficient amplification degree at each of these frequencies.

Further, according to the present invention, the above-mentioned amplifier, when the connection point of at least the two capacitors and ground or the ground terminal is connected by the switching means, the amplifier is connected to a first oscillator that outputs a signal having the first frequency, and when the connection point of at least the two capacitors and ground or the ground terminal is disconnected by the switching means, the amplifier is connected to a second oscillator that outputs a signal having the second frequency. This novel constitution can amplify the necessary one of the oscillation signals in an interlocking manner.

Still further, according to the present invention, in the above-mentioned amplifier, the bypass capacitor and the capacitor on the ground side are leadless laminated capacitors. This novel constitution facilitates the setting of the capacity of the bypass capacitor of the emitter.

Yet further, according to the present invention, constituting a portable telephone apparatus by use of the above-mentioned amplifier eliminates the necessity for providing an amplifier for each of the different frequencies due to different communication schemes. This novel constitution provides a high amplification degree despite the different frequencies, resulting in the portable telephone apparatus reduced in size, weight, and cost.

In addition, according to the present invention, the internal circuits of the above-mentioned portable telephone apparatus can be switched by only the single amplifier for amplifying the local oscillator such that a sufficient amplification degree is provided for each of the different frequencies, and the amplifier switching and the frequency switching of the local oscillator can be performed in an interlocking manner. Therefore, the frequency of the received signal changes due to different communication schemes, the signal having a changed frequency can be received without a special additional operation and without losing the characteristics such as frequency conversion, thereby providing the ease-to-use portable telephone apparatus.

While the preferred embodiments of the present invention have been described using specific terms, such description is for illustrative purposes only, and it is to be understood that changes and variations may be made without departing from the spirit or scope of the appended claims.

What is claimed is:

1. An amplifier for amplifying first and second oscillation signals having different frequencies and being alternatively transmitted to said amplifier, said amplifier comprising:
    an amplifying transistor having an input terminal, an output terminal and a ground terminal;
    a first resonant capacitor having a first end connected to the output terminal of said amplifying transistor, the first resonant capacitor also having a second end;
    a second resonant capacitor connected between the second end of said first resonant capacitor and the ground terminal of said amplifying transistor;

a bypass capacitor connected between the ground terminal of said amplifying transistor and ground; and switching means connected between ground and the second end of said first resonant capacitor for activating and deactivating the connection therebetween.

2. An amplifier according to claim 1, wherein said switching means activates said connection when the first oscillation signal having the lower frequency of said first and second oscillation signals is input to said amplifier, and said switching means deactivates said connection when the second oscillation signal having the higher frequency of said first and second oscillation signals is input to said amplifier.

3. An amplifier according to claim 1, wherein said second resonant capacitor and said bypass capacitor are leadless, laminated capacitors, the reactance of said second resonant capacitor is sufficiently low against the first oscillation signal having the lower frequency of said first and second oscillation signals, and the reactance of said bypass capacitor is sufficiently low against a second oscillation signal having the higher frequency of said first and second oscillation signals.

4. An amplifier for amplifying first and second oscillation signals having different frequencies and being input alternatively, said amplifier comprising:

an amplifying transistor having an input terminal, an output terminal and a ground terminal;

a first resonant capacitor having a first end connected to the output terminal of said amplifying transistor, the first resonant capacitor also having a second end;

a second resonant capacitor connected between the second end of said first resonant capacitor and ground;

a bypass capacitor connected between the ground terminal of said amplifying transistor and ground; and switching means connected between the ground terminal of said amplifying transistor and the second end of said first resonant capacitor for activating and deactivating the connection therebetween.

5. An amplifier according to claim 4, wherein said switching means activates said connection when the first oscillation signal having the lower frequency of said first and second oscillation signals is input to said amplifier, and said switching means deactivates said connection when the second oscillation signal having the higher frequency of said first and second oscillation signals is input to said amplifier.

6. An amplifier according to claim 4, wherein said second resonant capacitor and said bypass capacitor are leadless, laminated capacitors, the reactance of said second resonant capacitor is sufficiently low against the first oscillation signal having the lower frequency of said first and second oscillation signals, and the reactance of said bypass capacitor is sufficiently low against the second oscillation signal having the higher frequency of said first and second oscillation signals.

7. A portable telephone apparatus comprising an amplifier for amplifying first and second oscillation signals having different frequencies and being input alternatively, wherein said amplifier comprises:

an amplifying transistor having an input terminal, an output terminal and a ground terminal;

a first resonant capacitor having a first end connected to the output terminal of said amplifying transistor, the first resonant capacitor also having a second end;

a second resonant capacitor connected between the second end of said first resonant capacitor and ground;

a bypass capacitor connected between the ground terminal of said amplifying transistor and ground; and switching means connected between the ground terminal of said amplifying transistor and the second end of said first resonant capacitor for activating and deactivating the connection therebetween.

8. A portable telephone apparatus according to claim 7, further comprising:

an oscillator for alternatively outputting said first and second oscillation signals having different frequencies; and a mixer for converting the frequency of a received signal by use of a signal output from said amplifier.

9. A portable telephone apparatus comprising an amplifier for amplifying first and second oscillation signals having different frequencies and being input alternatively, wherein said amplifier comprises:

an amplifying transistor having an input terminal, an output terminal and a ground terminal;

a first resonant capacitor having a first end connected to the output terminal of said amplifying transistor, the first resonant capacitor also having a second end;

a second resonant capacitor connected between the second end of said first resonant capacitor and ground;

a bypass capacitor connected between the ground terminal of said amplifying transistor and ground; and switching means connected between the ground terminal of said amplifying transistor and the second end of said first resonant capacitor for activating and deactivating the connection therebetween.

10. A portable telephone apparatus according to claim 9, further comprising:

an oscillator for alternatively outputting said first and second oscillation signals having different frequencies; and a mixer for converting the frequency of a received signal by use of a signal output from said amplifier.

* * * * *